United States Patent
Kurosawa et al.

(10) Patent No.: US 7,005,248 B2
(45) Date of Patent: Feb. 28, 2006

(54) METHOD OF FORMING CAVITY BETWEEN MULTILAYERED WIRINGS

(75) Inventors: Takahiko Kurosawa, Tokyo (JP); Kaori Shirato, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/693,972

(22) Filed: Oct. 28, 2003

(65) Prior Publication Data

US 2004/0092127 A1    May 13, 2004

(30) Foreign Application Priority Data

Oct. 29, 2002   (JP) ............................. 2002-314248

(51) Int. Cl.
*G03C 5/00*    (2006.01)

(52) U.S. Cl. .................. 430/322; 430/324; 430/325; 430/270.1

(58) Field of Classification Search ............... 430/322, 430/324, 325, 270.1
See application file for complete search history.

(56) References Cited

U.S. PATENT DOCUMENTS

| | | | | |
|---|---|---|---|---|
| 6,165,890 A | * | 12/2000 | Kohl et al. | 438/619 |
| 6,777,159 B1 | * | 8/2004 | Itatani et al. | 430/270.1 |
| 2004/0132243 A1 | * | 7/2004 | Kurosawa et al. | 438/200 |

* cited by examiner

*Primary Examiner*—John A. McPherson
*Assistant Examiner*—Daborah Chacko-Davis
(74) *Attorney, Agent, or Firm*—Oblon, Spivak, McClelland, Maier & Neustadt, P.C.

(57) ABSTRACT

A method that can readily form a cavity structure between metallic wirings in, for example, semiconductors using a polyamic acid and/or a polyimide obtained by reacting a specific alicyclic tetracarboxylic acid dianhydride and a specific alicyclic diamine. The method includes a step of coating the surface of a first dielectric film formed on a semiconductor substrate with a polyamic acid and/or a polyimide, a step of patterning a cavity-forming polymer between the multilayered wirings, a step of forming a second dielectric film on the cavity-forming polymer between the multilayered wirings containing a metallic wiring, and a step of removing the cavity-forming polymer between the multilayered wirings by heating to form a cavity between the metallic wirings.

18 Claims, 1 Drawing Sheet

METHOD OF FORMING CAVITY BETWEEN MULTILAYERED WIRINGS

FIELD OF THE INVENTION

The present invention relates to a method of forming a cavity between wirings using a heat decomposable alicyclic polymer that is a polyamic acid and/or a polyimide obtained by reacting a specific alicyclic tetracarboxylic acid dianhydride and a specific alicyclic diamine, reveals a specific heat resistant temperature and a specific heat decomposition temperature, and can readily form a cavity structure between metallic wirings in, for example, semiconductors.

DESCRIPTION OF THE RELATED ART

Hitherto, silica ($SiO_2$) films formed by the vacuum process such as the CVD process have widely been employed as a dielectric film in semiconductors, etc. Further, coating type dielectric films containing a tetraalkoxysilane hydrolyzate as the major component and called an SOG (Spin on Glass) film are employed mainly for the purpose of flattening. In recent years, following large scale integration of semiconductor devices and the like, a demand for low dielectric constant dielectric films is increasing for the purpose of reducing a wiring parasitic capacitance to improve the wiring delay. However, since relatively minute films are obtained by the CVD process, it is difficult to obtain a low dielectric constant of 2.5 or less. According to realization of a high porosity of SOG, since the dielectric constant increases with an increase in hygroscopicity following the realization of a high porosity, the effect of realizing a low dielectric constant by a reduction of film density is cancelled so that it is difficult to obtain low-dielectric constant films. While dielectric films with a low dielectric constant containing a polyorganosiloxane as the major component and called organic SOG are developed, in the case where it is intended to obtain a low dielectric constant of 2.3 or less, there is a problem such that a film strength necessary for formation processing of semiconductor devices is not obtained.

As the method of reducing a wiring parasitic capacitance, there are proposed semiconductor devices having a cavity between wirings as described in, for example, JP-A-9-172068, JP-A-8-83839, and JP-A-2001-85519.

However, according to these prior art methods, after preparing a structure in which a space between metallic wirings is filled with an organic resist or a silica compound, the organic resist or the silica compound is removed by etching or icing to form a cavity between the metallic wirings, and hence, a problem involved that the operation is complicated.

SUMMARY OF THE INVENTION

Accordingly, an object of the present invention is to provide a method that can readily form a cavity structure between metallic wirings in, for example, semiconductors using a polyamic acid and/or a polyimide obtained by reacting a specific alicyclic tetracarboxylic acid dianhydride and a specific alicyclic diamine.

The method comprises:

a step of coating the surface of a first dielectric film formed on a semiconductor substrate with a polyamic acid and/or a polyimide obtained from at least one alicyclic tetracarboxylic acid dianhydride represented by the general formula (1) shown hereinafter and at least one alicyclic diamine represented by the general formula (2) shown hereinafter, a step of patterning the polyamic acid and/or the polyimide as a cavity-forming polymer, a step of forming a second dielectric film on the cavity-forming polymer containing a metallic wiring, and a step of removing the cavity-forming polymer between the multilayered wirings by heating to form a cavity between the metallic wirings.

BRIEF DESCRIPTION OF THE DRAWING

The FIGURE is a view showing a process of the formation method of a cavity between metallic wirings according to the present invention.

In the drawing:
1: Dielectric film 1
2: Polymer
3: Metal
4: Dielectric film 2
5: Cavity

DETAILED DESCRIPTION OF THE INVENTION

Figure 1A:
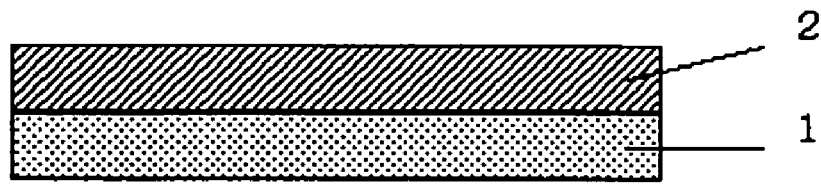

The present invention will be described in detail below.

A cavity-forming polymer between multilayered wirings used the present invention is a polyamic acid and/or a polyimide obtained from at least one alicyclic tetracarboxylic acid dianhydride represented by the following general formula (1) and at least one alicyclic diamine represented by the following general formula (2).

General formula (1)

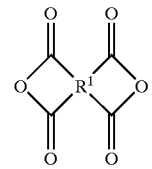

General Formula (2)

$H_2N—R^2—NH_2$

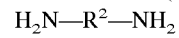

In the formula (1), $R^1$ represents a tetravalent alicyclic hydrocarbon group having 4–20 carbon atoms. The tetravalent alicyclic hydrocarbon group can contain a cyclic ether structure in the molecule. In the formula (2), $R^2$ represents a divalent alicyclic hydrocarbon group having 4–20 carbon atoms.

Examples of the tetravalent alicyclic hydrocarbon group having 4–20 carbon atoms represented by $R^1$ in the general formula (1) include tetravalent alicyclic hydrocarbon groups represented by the following formulae (3) to (27).

Formula (3)

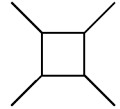

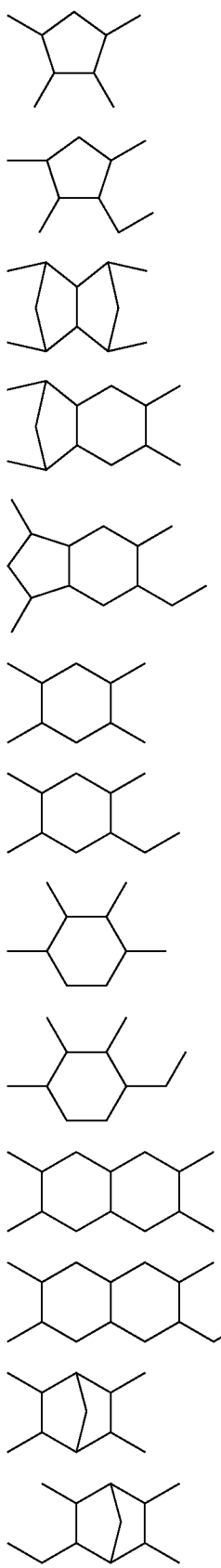
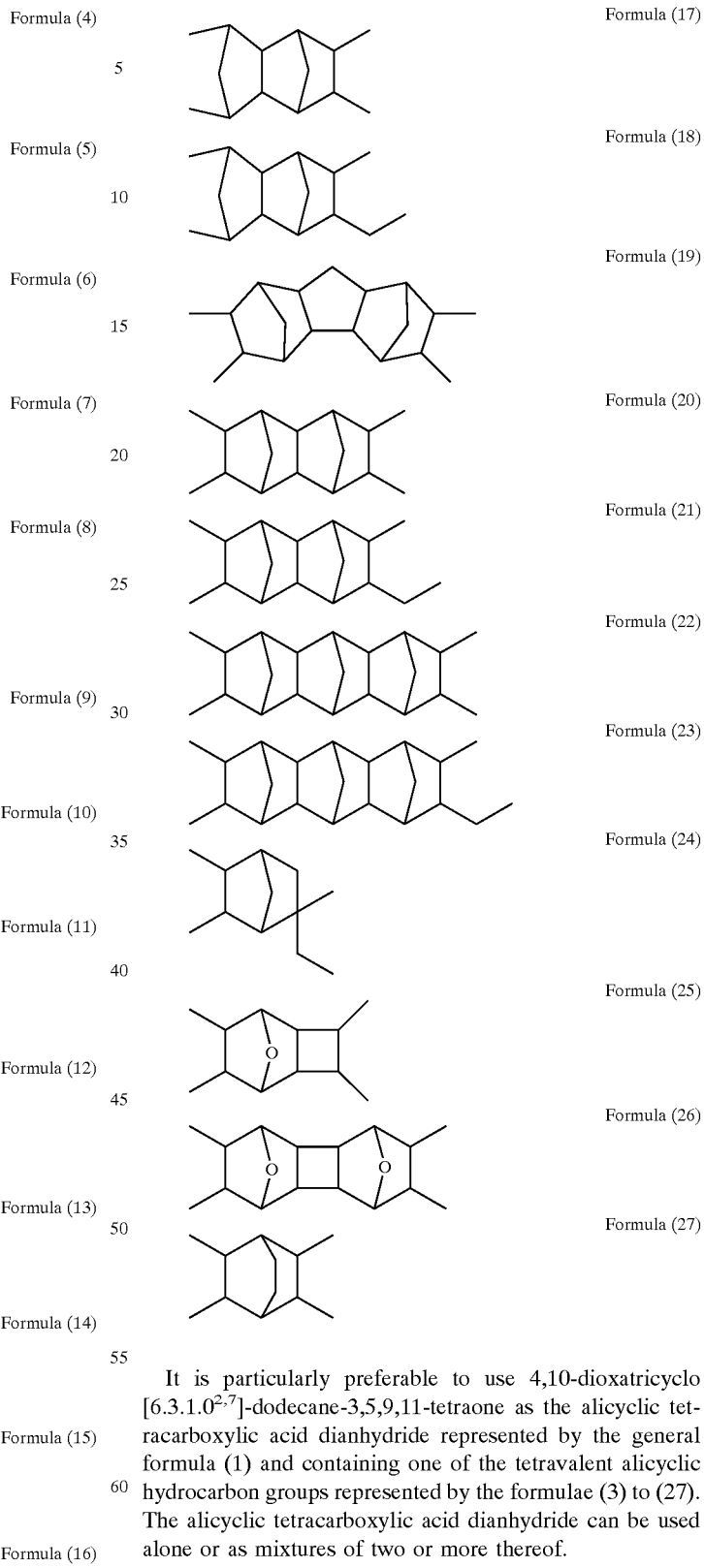

It is particularly preferable to use 4,10-dioxatricyclo[6.3.1.0$^{2,7}$]-dodecane-3,5,9,11-tetraone as the alicyclic tetracarboxylic acid dianhydride represented by the general formula (1) and containing one of the tetravalent alicyclic hydrocarbon groups represented by the formulae (3) to (27). The alicyclic tetracarboxylic acid dianhydride can be used alone or as mixtures of two or more thereof.

Examples of the divalent alicyclic hydrocarbon group having 4–20 carbon atoms represented by $R^2$ in the general formula (2) include divalent alicyclic hydrocarbon groups represented by the following formulae (28) to (61).

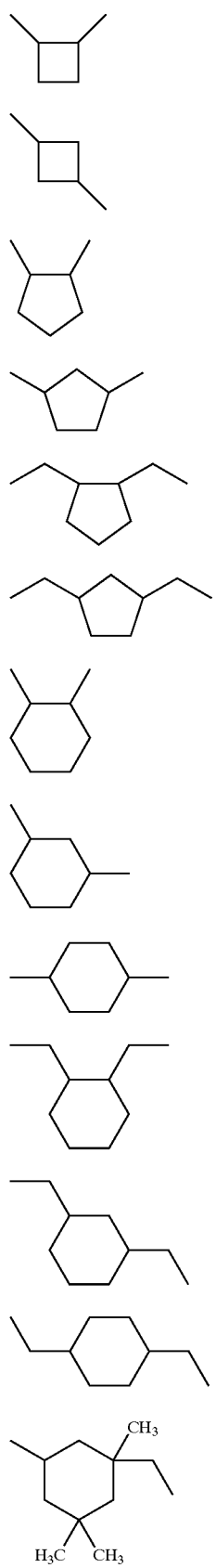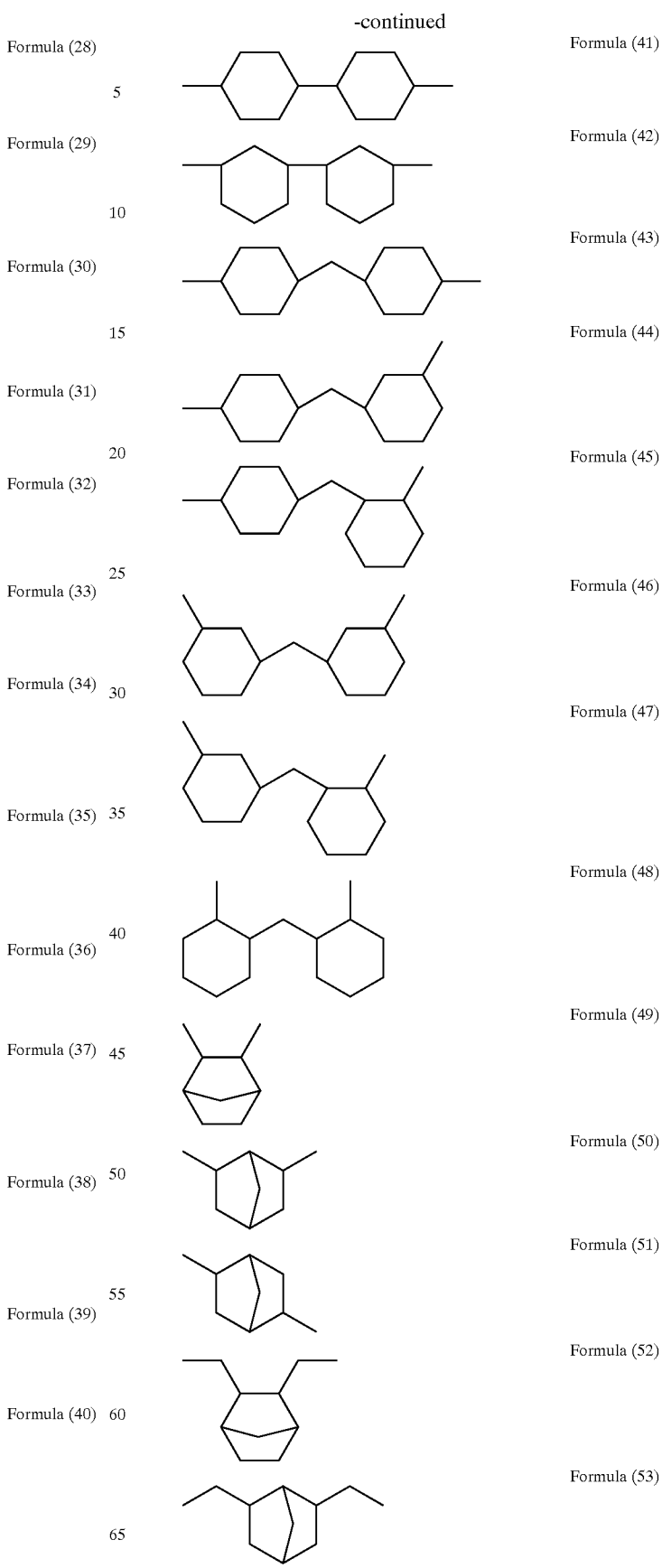

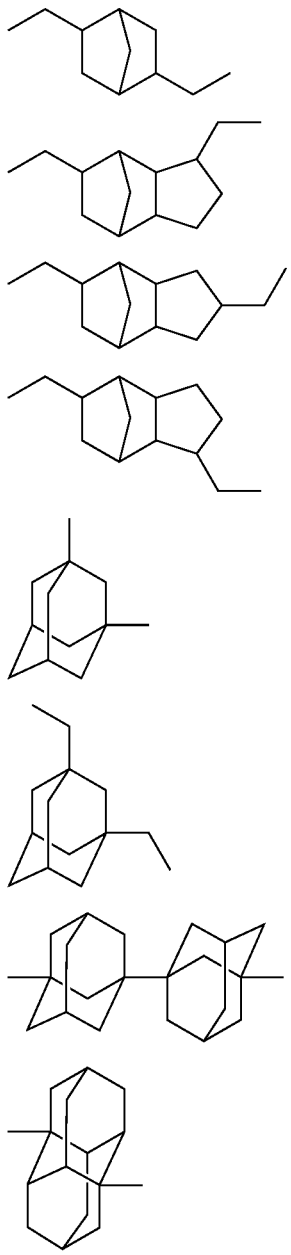

Formula (54)

Formula (55)

Formula (56)

Formula (57)

Formula (58)

Formula (59)

Formula (60)

Formula (61)

It is preferable to use 1,3-diaminocyclohexane, 1,4-diaminocyclohexane, 1,2-bisaminomethylcyclohexane, 1,3-bisaminomethylcyclohexane, 1,4-bisaminomethylcyclohexane, isophoronediamine, 4,4'-diaminobiscyclohexyl, 3,3'-diaminobiscyclohexyl, bis(4-aminocyclohexyl)methane, bis(3-aminocyclohexyl)methane, 2,6-diamino-dicyclo[2.2.1]heptane, 2,5-diamino-dicyclo[2.2.1]heptane, 2,3-bis(aminomethyl)-dicyclo[2.2.1]heptane, 2,5-bis(aminomethyl)-dicyclo[2.2.1]heptane, 2,6-bis(aminomethyl)-dicyclo[2.2.1]-heptane, 3,9-bis(aminomethyl)-tricyclo[6.2.1.0$^{2,6}$]decane, 4,9-bis(aminomethyl)-tricyclo[6.2.1.0$^{2,6}$]decane, 5,9-bis(aminomethyl)-tricyclo [6.2.1.0$^{2,6}$]decane, 1,3-diaminoadamantane, or 1,3-bis(aminomethyl)adamantane as the alicyclic diamine represented by the general formula (2) and containing one of the divalent alicyclic hydrocarbon groups represented by the formulae (28) to (61). The alicyclic diamine can be used alone or as mixtures of two or more thereof.

The polyamic acid and/or the polyimide that is the cavity-forming polymer between metallic wirings is prepared by the following method.

First of all, at least one aliphatic tetracarboxylic acid dianhydride represented by the general formula (1) and at least one alicyclic diamine represented by the general formula (2) are reacted in an aprotic polar solvent and/or a phenol based solvent in a solids concentration of 1–30% by weight at a temperature in the range of 0–150° C. for 1–24 hours, to obtain a polyamic acid solution. If required and necessary, a dehydrating agent in an amount of 1–20 moles per mole of the aliphatic tetracarboxylic acid dianhydride represented by the general formula (1) and an imidation catalyst in an amount of 0.5–30 moles per mole of the aliphatic tetracarboxylic acid dianhydride represented by the general formula (1) are added to react the resulting polyamic acid solution at a temperature in the range of 0–180° C. for 1–24 hours. Thus, a polyimide solution is obtained. In the present invention, it is not always required for the polyamic acid used to be entirely imidated, but the polyimide that can be used includes polyimides in which the polyamic acid is partially imidated. The polyamic acid solution and/or the polyimide solution used in the present invention can be substituted with other organic solvent by the conventional procedure, if desired.

The aprotic polar solvent used in the present invention is not particularly limited so far as it can dissolve the polyamic acid formed by the reaction therein. Preferred examples of the aprotic polar solvent include γ-butyrolactone, cyclohexanone, N-methyl-2- pyrrolidone, N,N-dimethylacetamide, N,N-dimethylformamide, dimethyl sulfoxide, tetramethylurea, and hexamethyl sulfonamide.

The phenol based solvent used in the present invention is not particularly limited so far as it can dissolve the polyamic acid formed by the reaction therein. Preferred examples phenol based include m-cresol, xylenol, phenol, and halogenated phenols.

In the invention, it is preferable to use the alicyclic tetracarboxylic acid dianhydride represented by the general formula (1) and the alicyclic diamine represented by the general formula (2) while adjusting the use proportion such that the amount of the acid anhydride group in the alicyclic tetracarboxylic acid anhydride is 0.2–2 equivalents, and preferably 0.7–1.3 equivalents, to one equivalent of the amino group in the alicyclic diamine compound.

The dehydrating agent used in the present invention is not particularly limited so far as it can be dissolved or dispersed in the aprotic polar solvent and/or phenol based solvent. Preferred examples include acetic anhydride, propionic anhydride, and trifluoroacetic anhydride.

The imidation catalyst used in the invention is not particularly limited so far as it is a tertiary amine that can be dissolved or dispersed in the aprotic polar solvent and/or phenol based solvent. Preferred examples include aliphatic tertiary amines such as trimethylamine, triethylamine, tripropylamine or tributylamine; aromatic tertiary amines such as N,N-dimethylaniline; and heterocyclic compounds such as pyridine, 2-methylpyridine, N-methylimidazole or quinoline.

The substitution solvent used in the present invention is not particularly limited so far as it is an organic solvent that can dissolve the polyamic acid and/or polyimide therein.

Preferred examples include the above-described aprotic solvents, the above-described phenol based solvents, and alcohol based solvents such as diacetone alcohol.

The polyamic acid and/or polyimide synthesized according to the above method preferably has a weight average molecular weight, as reduced into polystyrene measured by gel permeation chromatography, in the range of 1,000–500,000. When the molecular weight range falls outside the range, heat resistance of the resulting polymer may be insufficient, or the solution viscosity increases so that handling properties such as coating properties may be lowered, and hence, such is not preferable.

It is possible to adjust the molecular weight of the polyamic acid and/or polyimide by adjusting the amounts of the alicyclic tetracarboxylic acid dianhydride and the alicyclic diamine used and further by properly adding a carboxylic acid monoanhydride or a monoamine, if required and necessary.

The alicyclic polymer used in the present invention has a weight loss on heating at 350° C. for one hour in an inert gas atmosphere and/or a vacuum atmosphere of 5% by weight or less and a weight loss on heating at 500° C. for one hour in an inert gas atmosphere and/or a vacuum atmosphere of 80% by weight or more. The heat decomposable alicyclic polymer having a specific heat resistant temperature and a specific heat decomposition temperature can be removed only by simple heat treatment and has a mechanical strength that is sufficiently adaptive to the wiring processing process at temperatures of the heat resistant temperature or lower. Accordingly, it is possible to readily form a cavity structure between metallic wirings in semiconductors, etc., by using the alicyclic polymer of the present invention.

Examples of the inert gas include rare gases such as helium, neon, argon, krypton, xenon or radon, and nitrogen. The inert gas generally used has a purity of 99.9% or more. The inert gas having a purity of 99.99% or more is preferably used, and the inert gas having a purity of 99.999% or more is particularly preferably used. Preferable examples of the inert gas used are nitrogen, argon, and helium. The vacuum atmosphere is usually 100 Torr or less, preferably 10 Torr or less, and more preferably 1 Torr or less.

The alicyclic polymer used in the present invention usually has a weight loss on heating at 350° C. for one hour in an inert gas atmosphere and/or a vacuum atmosphere of 5% by weight or less, preferably 3% by weight or less, and more preferably 1% by weight or less. The alicyclic polymer is thermally stable at a temperature of 350° C. or lower at which processing of metallic wirings, etc., of semiconductor devices is usually carried out and therefore, is preferable as a material for formation processing of semiconductor devices.

The alicyclic polymer usually has a weight loss on heating at 500° C. for one hour in an inert gas atmosphere and/or a vacuum atmosphere of 80% by weight or more, preferably 90% by weight or more, and more preferably 95% by weight or more. For the sake of promoting the decomposition of the alicyclic polymer, it is possible to incorporate hydrogen, oxygen, ammonia, water, etc., in the inert gas atmosphere. The amount of the component incorporated is not particularly limited but is usually 50% by volume or less, and preferably 25% by volume or less. The alicyclic polymer has good heat decomposition properties at 500° C. or lower and can be removed only by a simple heat treatment without necessity of an operation, such as etching or icing, that is usually employed during the formation processing of semiconductor devices. This makes it possible to easily form a cavity structure between metallic wirings in semiconductor devices, etc.

The alicyclic polymer usually has a glass transition temperature of 200° C. or higher, preferably 220° C. or higher, and more preferably 240° C. or higher. As described above, the alicyclic polymer has a high glass transition temperature, and hence, is preferable from the standpoints that even when exposed to high temperatures during the formation of metallic wirings in the semiconductor device, it does not exhibit a large change in volume following phase transition and keeps stability of the wiring shape.

The alicyclic polymer has a mechanical strength sufficiently endurable to the formation processing of semiconductors. Specifically, since the alicyclic polymer usually has a hardness of 0.2 GPa or more, preferably 0.3 GPa or more, and more preferably 0.4 GPa or more, and usually has an elastic modulus of 5.0 GPa or more, preferably 6.0 GPa or more, and more preferably 7.0 GPa or more, it can be adapted to the formation processing of semiconductor devices such CMP.

If desired, the alicyclic polymer can be processed into a film shape and provided for the use. The film of the alicyclic polymer can be obtained by diluting the polyamic acid and/or polyimide with an organic solvent, etc., forming the solution into a film shape by various processes such as a spin coating process, a dip coating process, a roll coating process, a flow coating process, a spray coating process or a hot press process, and optionally heating at a temperature of the heat decomposition temperature or lower of the alicyclic polymer to remove the unnecessary organic solvent.

Figure 1B:
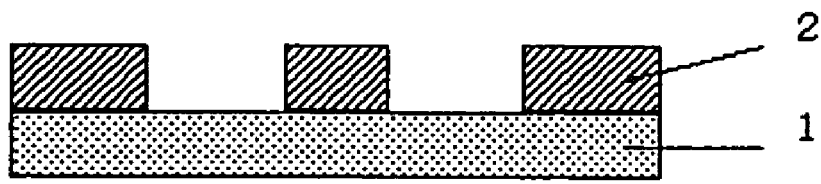
Figure 1C:
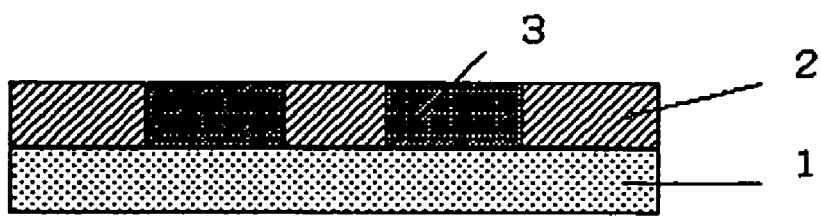
Figure 1D:
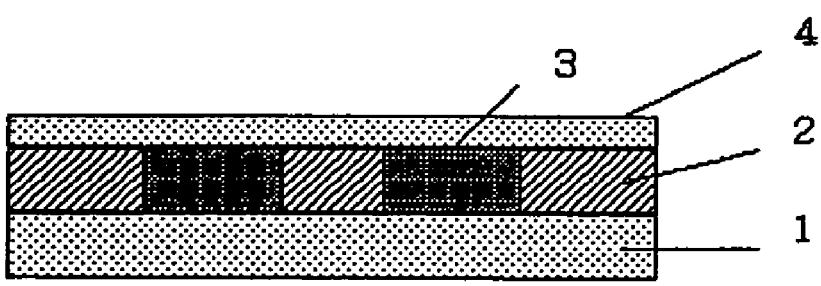
Figure 1E:
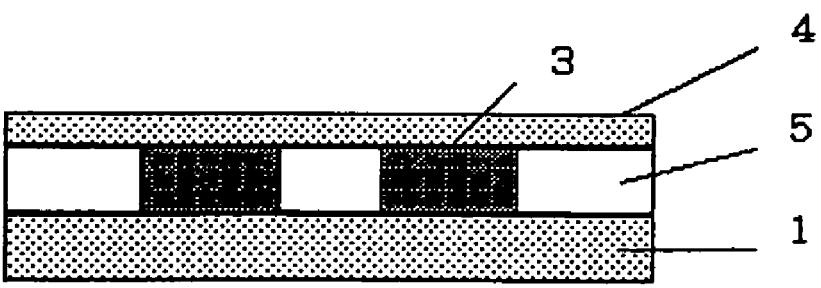

Using the alicyclic polymer makes it possible to easily form a cavity structure between metallic wirings in semiconductor devices, etc. Specifically, for example, the alicyclic polymer is applied to the surface of a prescribed first dielectric film of a semiconductor substrate (see FIG. 1A). The alicyclic polymer is patterned in a space for forming a metallic wiring using the conventional lithography technology and etching technology (see FIG. 1B). A metal such as Cu, Al, W or Mo is embedded in the pattern formed on the alicyclic polymer by the conventional method such as plating or CVD (see FIG. 1C). For the purpose of preventing diffusion of the metal during embedding the metal, a layer of TaN, TiN, etc., may be formed between the alicyclic polymer and the metal. After embedding the metal, the surface can be flattened by CMP. A second dielectric film is formed on the alicyclic polymer having the metal embedded therein by the conventional spin process, CVD process or the like (see FIG. 1D). Finally, the alicyclic polymer is removed upon heating, whereby a cavity can be formed between the metallic wirings (see FIG. 1E). The removal of the alicyclic polymer can be carried out every layer of the multilayered metallic wirings or by repeating the steps of FIG. 1A to FIG. 1D and then getting together some layers.

The present invention is described in more detail by reference to the following Examples. However, the Examples merely describe a summary of the embodiments of the present invention, and it should not be construed that the invention is limited thereto without particular reasons.

All parts and percentages in the Examples and Comparative Example are parts by weight and % by weight, respectively, unless otherwise indicated.

Various evaluations were carried out in the following methods.

Weight Average Molecular Weight:

A weight average molecular weight as reduced into polystyrene was measured by the GPC process.

Weight Loss:

Upon heating in a nitrogen atmosphere at an arbitrary temperature for one hour, a change in weight was measured by the thermogravity (TG) process.

Glass Transition Temperature:

A glass transition temperature was measured by the differential scanning calorimetry (DSC) process.

Elastic Modulus and Hardness:

The measurement was carried out by the nonaindentation process.

EXAMPLE 1

In an $N_2$ atmosphere, 13.47 g of 1,3-diaminocyclohexane was dissolved in 400 ml of N-methyl-2-pyrrolidone (NMP), and 26.90 g of 4,10-dioxatricyclo[$6.3.1.0^{2,7}$]-dodecane-3,5,9,11-tetraone was added to and suspended in the solution at 25° C. with stirring. The temperature was raised to 50° C., and the mixture was reacted for 6 hours. 400 ml of NMP was added to the reaction solution, and 48.17 g of acetic anhydride and 37.97 g of pyridine were then added thereto. The resulting mixture was reacted at 135° C. for 2 hours. Tthe reaction product was poured into a large amount of methanol to solidify a polymer, which was then recovered and dried at 80° C. overnight. As a result of the measurement by the GPC process, the resulting polymer was found to have a weight average molecular weight of 23,000. The resulting polymer was dissolved in N,N-dimethylacetamide (DMAc), and the solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above-described methods. The results obtained are shown in the Table below.

EXAMPLE 2

In an $N_2$ atmosphere, 13.47 g of 1,4-diaminocyclohexane was dissolved in 400 ml of NMP, and 26.90 g of 4,10-dioxatricyclo [$6.3.1.0^{2,7}$]dodecane-3,5,9,11-tetraone was added to and suspended in the solution at 25° C. with stirring. The temperature was raised to 50° C., and the mixture was reacted for 6 hours. As a result of the measurement by the GPC process, the resulting polymer was found to have a weight average molecular weight of 26,000. The resulting polymer solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

EXAMPLE 3

In an $N_2$ atmosphere, 16.78 g of 1,3-bis(aminomethyl)cyclohexane was dissolved in 400 ml of NMP, and 26.90 g of 4,10-dioxatricyclo[$6.3.1.0^{2,7}$]dodecane-3,5,9,11-tetraone was a added to and suspended in the solution at 25° C. with stirring. The temperature was raised to 50° C., and the mixture was reacted for 6 hours. 400 ml of NMP was added to the reaction solution, and 48.17 g of acetic anhydride and 37.97 g of pyridine were then added thereto. The mixture was reacted at 135° C. for 4 hours. The reaction product was poured into a large amount of methanol to solidify a polymer, which was then recovered and dried at 80° C. overnight. As a result of the measurement by the GPC process, the resulting polymer was found to have a weight average molecular weight of 21,000. The resulting polymer was dissolved in γ-butyrolactone (GBL), and the solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

EXAMPLE 4

In an $N_2$ atmosphere, 18.20 g of 2,6-bis(aminomethyl)dicyclo[2.2.1]heptane was dissolved in 400 ml of NMP, and 26.90 g of 4,10-dioxatricyclo[$6.3.1.0^{2,7}$]dodecane-3,5,9,11-tetraone was added to and suspended in the solution at 25° C. with stirring. The temperature was raised to 50° C., and the mixture was reacted for 6 hours. 400 ml of NMP was added to the reaction solution, and 48.17 g of acetic anhydride and 37.97 g of pyridine were then added thereto. The mixture was reacted at 135° C. for 4 hours. The reaction product was poured into a large amount of methanol to solidify a polymer, which was then recovered and dried at 80° C. overnight. As a result of the measurement by the GPC process, the resulting polymer was found to have a weight average molecular weight of 19,000. The resulting polymer was dissolved in DMAc, and the solution was applied to a silicon wafer by the spin coating process. The silicon wafer was heat treated at 350° C. for 30 minutes to obtain a transparent coating film having a film thickness of 1 μm. This coating film was measured with respect to weight loss, glass transition temperature, elastic modulus and hardness according to the above methods. The results obtained are shown in the Table below.

EXAMPLE 5

In an $N_2$ atmosphere, 19.62 g of 1,3-diaminoadamantane was dissolved in 400 ml of NMP, and 26.90 g of 4,10-dioxatricyclo[$6.3.1.0^{2,7}$]dodecane-3,5,9,11-tetraone was added to and suspended in the solution at 25° C. with stirring. The temperature was raised to 50° C., and the mixture was reacted for 6 hours. 400 ml of NMP was added to the reaction solution, and 48.17 g of acetic anhydride and 37.97 g of pyridine were then added thereto. The mixture was reacted at 135° C. for 2 hours. The reaction product was poured into a large amount of methanol to solidify a polymer, which was then recovered and dried at 80° C. overnight. As a result of the measurement by the GPC process, the resulting polymer was found to have a weight average molecular weight of 25,000. The resulting polymer was dissolved in DMAc, and the solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

EXAMPLE 6

In an $N_2$ atmosphere, 13.47 g of 1,3-diaminocyclohexane was dissolved in 200 ml of NMP, and 28.34 g of 4,10-dioxatetracyclo[5.5.1 .$0^{2,6}$.$0^{8,12}$]tridecane-3,5,9,11-tetraone was added to and suspended in the solution at 25° C. with stirring. The temperature was raised to 50° C., and the mixture was reacted for 6 hours. As a result of the measurement by the GPC process, the resulting polymer was found to have a weight average molecular weight of 28,000. The resulting polymer solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

EXAMPLE 7

In an $N_2$ atmosphere, 18.20 g of 2,6-bis(aminomethyl)dicyclo[2.2.1]heptane was dissolved in 200 ml of NMP, and 28.34 g of 4,10-dioxatetracyclo[5.5.1.$0^{2,6}$.$0^{8,12}$]-tridecane-3,5,9, 11tetraone was added to and suspended in the solution at 25° C. with stirring. The temperature was raised to 50° C., and the mixture was reacted for 6 hours. As a result of the measurement by the GPC process, the resulting polymer was found to have a weight average molecular weight of 26,000. The resulting polymer solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

COMPARATIVE EXAMPLE 1

In an $N_2$ atmosphere, 11.42 g of 1,3-diaminocycloxeane was dissolved in 400 ml of NMP, and 33.63 g of 4,10-dioxatricyclo[6.3.1.$0^{2,7}$]dodecane-3,5,9,11-tetraone was added to and suspended in the solution at 25° C. with stirring. The temperature was raised to 50° C., and the mixture was reacted for 6 hours. 400 ml of NMP was added to the reaction solution, and 61.26 g of acetic anhydride and 47.47 g of pyridine were then added thereto. The mixture was reacted at 135° C. for 2 hours. As a result of the measurement by the GPC process, the resulting polymer was found to have a weight average molecular weight of 900. The resulting polymer solution was concentrated in vacuo so as to have a solids concentration of about 20% by weight and applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

COMPARATIVE EXAMPLE 2

In an $N_2$ atmosphere, 13.71 g of 1,6-diaminohexane was dissolved in 400 ml of NMP, and 26.90 g of 4,10-dioxatricyclo[6.3.1.$0^{2,7}$]dodecane-3,5,9,11-tetraone was added to and suspended in the solution at 25° C. with stirring. The temperature was raised to 50° C., and the mixture was reacted for 6 hours. 400 ml of NMP was added to the reaction solution, and 48.17 g of acetic anhydride and 37.97 g of pyridine were then added thereto. The mixture was reacted at 135° C. for 4 hours. The reaction product was poured into a large amount of methanol to solidify a polymer, which was then recovered and dried at 80° C. overnight. As a result of the measurement by the GPC process, the resulting polymer was found to have a weight average molecular weight of 23,000. The resulting polymer was dissolved in γ-butyrolactone (GBL), and the solution was applied to a silicon wafer by the spin coating process. The silicon wafer was heat treated at 350° C. for 30 minutes to obtain a transparent coating film having a film thickness of about 1 μm. This coating film was measured with respect to weight loss, glass transition temperature, elastic modulus and hardness according to the above methods. The results obtained are shown in the Table below.

COMPARATIVE EXAMPLE 3

In an $N_2$ atmosphere, 12.76 g of 1,3-diaminobenzene was dissolved in 400 ml of NMP, and 26.90 g of 4,10-dioxatricyclo[6.3.1.$0^{2,7}$]dodecane-3,5,9,11-tetraone was added to and suspended in the solution at 25° C. with stirring. The temperature was raised to 50° C., and the mixture was reacted for 6 hours. 400 ml of NMP was added to the reaction solution, and 48.17 g of acetic anhydride and 37.97 g of pyridine were then added thereto. The mixture was reacted at 135° C. for 4 hours. The reaction product was poured into a large amount of methanol to solidify a polymer, which was then recovered and dried at 80° C. overnight. As a result of the measurement by the C process, the resulting polymer was found to have a weight average molecular weight of 18,000. The resulting polymer was dissolved in DMAc, and the solution was applied to a silicon wafer by the spin coating process. The silicon wafer was heat treated at 350° C. for 30 minutes to obtain a transparent coating film having a film thickness of 1 μm. This coating film was measured with respect to weight loss, glass transition temperature, elastic modulus and hardness according to the above methods. The results obtained are shown in the Table below.

TABLE

|  | Weight average molecular weight | Weight loss (%) At 350° C. | Weight loss (%) At 500° C. | Glass transition temperature (° C.) | Elastic modulus (GPa) | Hardness (GPa) |
| --- | --- | --- | --- | --- | --- | --- |
| Example 1 | 23000 | 0.5 | 95 | >250 | 8.0 | 0.4 |
| Example 2 | 26000 | 0.6 | 95 | >250 | 7.8 | 0.4 |
| Example 3 | 21000 | 0.9 | 97 | >250 | 7.6 | 0.4 |
| Example 4 | 19000 | 0.7 | 96 | >250 | 8.5 | 0.5 |

| | Weight average molecular weight | Weight loss (%) At 350° C. | Weight loss (%) At 500° C. | Glass transition temperature (° C.) | Elastic modulus (GPa) | Hardness (GPa) |
|---|---|---|---|---|---|---|
| Example 5 | 25000 | 0.9 | 96 | >250 | 8.1 | 0.4 |
| Example 6 | 28000 | 0.8 | 97 | >250 | 7.7 | 0.4 |
| Example 7 | 26000 | 0.6 | 96 | >250 | 7.5 | 0.4 |
| Comparative Example 1 | 900 | 5.5 | 97 | >250 | 7.1 | 0.3 |
| Comparative Example 2 | 23000 | 6.3 | 97 | 230 | 5.0 | 0.2 |
| Comparative Example 3 | 18000 | 0.7 | 72 | >250 | 7.9 | 0.4 |

The present invention relates to an alicyclic polymer obtained by reacting a specific alicyclic tetracarboxylic acid dianhydride and a specific alicyclic diamine and to a process of producing the same. Since the alicyclic polymer has a specific heat resistant temperature and a specific heat decomposition temperature, it can be removed only by simple heat treatment and has a mechanical strength that is sufficiently adaptive to the wiring processing process at temperatures of the heat resistant temperature or lower. Accordingly, it is possible to readily form a cavity structure between metallic wirings in semiconductors, etc., by using the alicyclic polymer.

What is claimed is:

1. A method of forming a cavity between multilayered wirings, comprising:
   coating the surface of a first dielectric film formed on a semiconductor substrate with a polyamic acid and/or a polyimide obtained from at least one alicyclic tetracarboxylic acid dianhydride represented by the following general formula (1) and at least one alicyclic diamine represented by the following general formula (2):

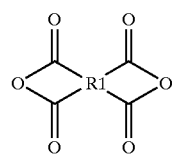
(1)

wherein $R^1$ represents a tetravalent alicyclic hydrocarbon group having 4–20 carbon atoms, the tetravalent alicyclic hydrocarbon group being able to contain a cyclic ether structure in the molecule, and

wherein $R^2$ represents a divalent alicyclic hydrocarbon group having 4–20 carbon atoms,
   patterning the polyamic acid and/or the polyimide as a cavity-forming polymer,
   embedding a metal in a pattern in the cavity-forming polymer to form a metallic wiring layer,
   forming a second dielectric film on the cavity-forming polymer containing the embedded metal, and
   removing the cavity-forming polymer present in the wiring layer by heating to form a cavity.

2. The method as claimed in claim 1, wherein the polyamic acid and/or the polyimide has a weight average molecular weight, as reduced into polystyrene, in the range of 1,000–500,000.

3. The method as claimed in claim 1, wherein the polyamic acid and/or the polyimide has a weight loss on heating at 350° C. for one hour in an inert gas atmosphere and/or a vacuum atmosphere of 5% by weight or less and a weight loss on heating at 500° C. for one hour in an inert gas atmosphere and/or a vacuum atmosphere of 80% by weight or more.

4. The method as claimed in claim 1, wherein the polyamic acid and/or the polyimide has a glass transition temperature of 200° C. or higher.

5. The method as claimed in claim 1, wherein the polyamic acid and/or the polyimide has an elastic modulus at 25° C. of 5 GPa or more.

6. The method as claimed in claim 1, wherein said alicyclic tetracarboxylic acid dianhydride represented by the general formula (1) is 4,10-dioxatricyclo [$6.3.1.0^{2,7}$]-dodecane- 3,5,9,11 -tetraone.

7. The method as claimed in claim 1, wherein said alicyclic diamine represented by the general formula (2) is a member selected from the group consisting of 1,3-diaminocyclohexane, 1,4-diaminocyclohexane, 1,2-bisaminomethylcyclohexane, 1,3-bisaminomethylcyclohexane, 1,4-bisaminomethylcyclo-hexane, isophoronediamine, 4,4'-diaminobiscyclohexyl, 3,3'-diaminobiscyclohexyl, bis(4-aminocyclohexyl) methane, bis(3-aminocyclohexyl) methane, 2,6-diamino-dicyclo[2.2.1]-heptane, 2,5-diamino-dicyclo[2.2.1]heptane, 2,3-bis(aminomethyl)-dicyclo[2.2.1] heptane, 2,5-bis(aminomethyl)-dicyclo[2.2.1]heptane, 2,6-bis(aminomethyl)-dicyclo[2.2.1]heptane, 3,9-bis(aminomethyl)-tricyclo[$6.2.1.0^{2,6}$]decane, 4,9-bis(aminomethyl)-tricyclo [$6.2.1.0^{2,6}$]decane, 5,9-bis(aminomethyl)- tricyclo[$6.2.1.0^{2,6}$]decane, 1,3-diaminoadamantane, or 1,3-bis(aminomethyl)adamantane and mixtures thereof.

8. The method as claimed in claim 1, wherein said aliphatic tetracarboxylic acid dianhydride represented by the general formula (1) and said alicyclic diamine represented by the general formula (2) are reacted in an aprotic polar solvent and/or a phenol based solvent in a solids concentration of 1–30 % by weight at a temperature in the range of 0–150° C. for 1–24 hours, to obtain a polyamic acid solution.

9. The method as claimed in claim 8, further comprising:
   adding a dehydrating agent in an amount of 1–20 moles per mole of the aliphatic tetracarboxylic acid dianhydride represented by the general formula (1).

10. The method as claimed in claim 9, wherein said dehydrating agent is selected from the group consisting of acetic anhydride, propionic anhydride, trifluoroacetic anhydride and mixtures thereof.

11. The method as claimed in claim 9, wherein said imidation catalyst is a tertiary amine that can be dissolved or dispersed in the aprotic polar solvent and/or phenol based solvent.

12. The method as claimed in claim 9, wherein said imidation catalyst is an aliphatic tertiary amine selected from the group consisting of trimethylamine, triethylamine, tripropylamine, tributylamine and mixtures thereof.

13. The method as claimed in claim 9, wherein said imidation catalyst is N,N-dimethylaniline.

14. The method as claimed in claim 9, wherein said imidation catalyst is selected from the group consisting of pyridine, 2-methylpyridine, N-methylimidazole, quinoline and mixtures thereof.

15. The method as claimed in claim 8, further comprising: adding an imidation catalyst in an amount of 0.5–30 moles per mole of the aliphatic tetracarboxylic acid dianhydride represented by the general formula (1).

16. The method as claimed in claim 8, wherein said aprotic polar solvent is selected from the group consisting of γ-butyrolactone, cyclohexanone, N-methyl-2-pyrrolidone, N,N-dimethylacetamide, N,N-dimethylformamide, dimethyl sulfoxide, tetramethylurea, hexamethyl sulfonamide and mixtures thereof.

17. The method as claimed in claim 8, wherein said phenol based solvent is selected from the group consisting of m-cresol, xylenol, phenol, halogenated phenols and mixtures thereof.

18. The method as claimed in claim 1, wherein said alicyclic tetracarboxylic acid dianhydride represented by the general formula (1) and said alicyclic diamine represented by the general formula (2) are used in a proportion so that an amount of the acid anhydride group in the alicyclic tetracarboxylic acid anhydride is 0.2–2 equivalents to one equivalent of the amino group in the alicyclic diamine compound.

* * * * *